United States Patent
Lee et al.

(10) Patent No.: US 11,181,831 B2
(45) Date of Patent: Nov. 23, 2021

(54) METHODS OF MANUFACTURING SEMICONDUCTOR DEVICE

(71) Applicant: Samsung Electronics Co., Ltd., Suwon-si (KR)

(72) Inventors: Kyoung-hwan Lee, Hwaseong-si (KR); Young-ho Kwon, Hwaseong-si (KR); Souk Kim, Seoul (KR); Young-hoon Sohn, Incheon (KR); Yu-sin Yang, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 258 days.

(21) Appl. No.: 16/558,860

(22) Filed: Sep. 3, 2019

(65) Prior Publication Data
US 2020/0194317 A1 Jun. 18, 2020

(30) Foreign Application Priority Data
Dec. 12, 2018 (KR) .......................... 10-2018-0160348

(51) Int. Cl.
*G03F 7/20* (2006.01)
(52) U.S. Cl.
CPC ............................... *G03F 7/70633* (2013.01)
(58) Field of Classification Search
CPC .................................................. G03F 7/70633
USPC .......................................................... 430/22
See application file for complete search history.

(56) References Cited

U.S. PATENT DOCUMENTS

| 7,894,062 | B2 | 2/2011 | Choi et al. |
| 8,139,217 | B2 | 3/2012 | Van Bilsen et al. |
| 9,239,523 | B2 | 1/2016 | Li et al. |
| 9,747,682 | B2 | 8/2017 | Lee et al. |
| 9,909,996 | B2 | 3/2018 | Den Boef |
| 10,983,005 | B2 * | 4/2021 | Wu ........................ G01J 3/2803 |
| 2011/0317163 | A1 | 12/2011 | Lee et al. |
| 2017/0082932 | A1 | 3/2017 | Fu et al. |

FOREIGN PATENT DOCUMENTS

JP        2005-294776 A      10/2005

* cited by examiner

*Primary Examiner* — Christopher G Young
(74) *Attorney, Agent, or Firm* — Harness, Dickey & Pierce, P.L.C.

(57) ABSTRACT

A method of manufacturing a semiconductor device includes forming a plurality of overlay molds on a semiconductor structure by developing a photoresist material layer of the semiconductor structure, the semiconductor structure including a first layer having a plurality of overlay marks, the plurality of overlay molds at least partially overlapping at least some of the plurality of overlay marks; and measuring one or more overlays by radiating a light having a wavelength band onto the semiconductor structure, each of the one or more overlays indicating an amount of consistency of the first layer and a second layer of the semiconductor structure, the wavelength band being set based on the plurality of overlay marks and the plurality of overlay molds, the second layer being between the first layer and the photoresist material layer.

20 Claims, 17 Drawing Sheets

METHODS OF MANUFACTURING SEMICONDUCTOR DEVICE

CROSS-REFERENCE TO RELATED APPLICATION

This application claims priority under 35 U.S.C. § 119 to Korean Patent Application No. 10-2018-0160348, filed on Dec. 12, 2018, in the Korean Intellectual Property Office, the disclosure of which is incorporated herein in its entirety by reference.

BACKGROUND

Some example embodiments relate to methods of manufacturing a semiconductor device, and more particularly, to methods of manufacturing a semiconductor device, whereby a process of manufacturing a semiconductor device may be monitored.

In order to manufacture a semiconductor device, a variety of semiconductor processes are performed on a wafer formed of a semiconductor material, etc. The semiconductor processes may include, for example, a deposition process in which a material layer is deposited on a wafer, a photolithography process in which patterns are to be defined on the wafer, an etching process in which the material layer on the wafer is etched, and a process of implanting impurities into the wafer. These semiconductor processes are performed so that the semiconductor device may be formed according to a designed layout. After the semiconductor processes are performed, a variety of methods of checking progression states of the semiconductor processes and defects therein have been studied.

SUMMARY

Some example embodiments provide a method of manufacturing a semiconductor device, whereby reliability is improved.

According to some example embodiments, there is provided a method of manufacturing a semiconductor device, the method including forming a plurality of overlay molds on a semiconductor structure by developing a photoresist material layer of the semiconductor structure, the semiconductor structure including a first layer having a plurality of overlay marks, the plurality of overlay molds at least partially overlapping at least some of the plurality of overlay marks, and measuring one or more overlays by radiating a light having a wavelength band onto the semiconductor structure, each of the one or more overlays indicating an amount of consistency of the first layer and a second layer of the semiconductor structure, the wavelength band being set based on the plurality of overlay marks and the plurality of overlay molds, the second layer being between the first layer and the photoresist material layer.

According to some example embodiments, there is provided a method of manufacturing a semiconductor device, the method including radiating light having a wavelength band onto a semiconductor structure, the semiconductor structure having a first layer, a second layer on the first layer, and a photoresist pattern on the second layer, the first layer including a plurality of overlay marks, the photoresist pattern including an overlay mold, the wavelength band being set based on the plurality of overlay marks and the overlay mold, diffracting the light to generate diffracted light, and splitting the diffracted light according to wavelength.

According to some example embodiments, there is provided a method of manufacturing a semiconductor device, the method including selecting a plurality of wavelengths based on an overlay spectrum including a plurality of determined overlay values corresponding to different wavelengths of light, the plurality of determined overlay values being based on a plurality of overlay marks and an overlay mold of a semiconductor structure, the semiconductor structure including a first layer, a second layer on the first layer, and a photoresist material layer on the second layer, the first layer including the plurality of overlay marks, the photoresist material layer including the overlay mold, measuring one or more overlays by radiating a light including the plurality of wavelengths onto the semiconductor structure, diffracting the light to generate diffracted light, and splitting the diffracted light according to wavelength.

BRIEF DESCRIPTION OF THE DRAWINGS

Some example embodiments will be more clearly understood from the following detailed description taken in conjunction with the accompanying drawings in which.

DETAILED DESCRIPTION

Figure 1:
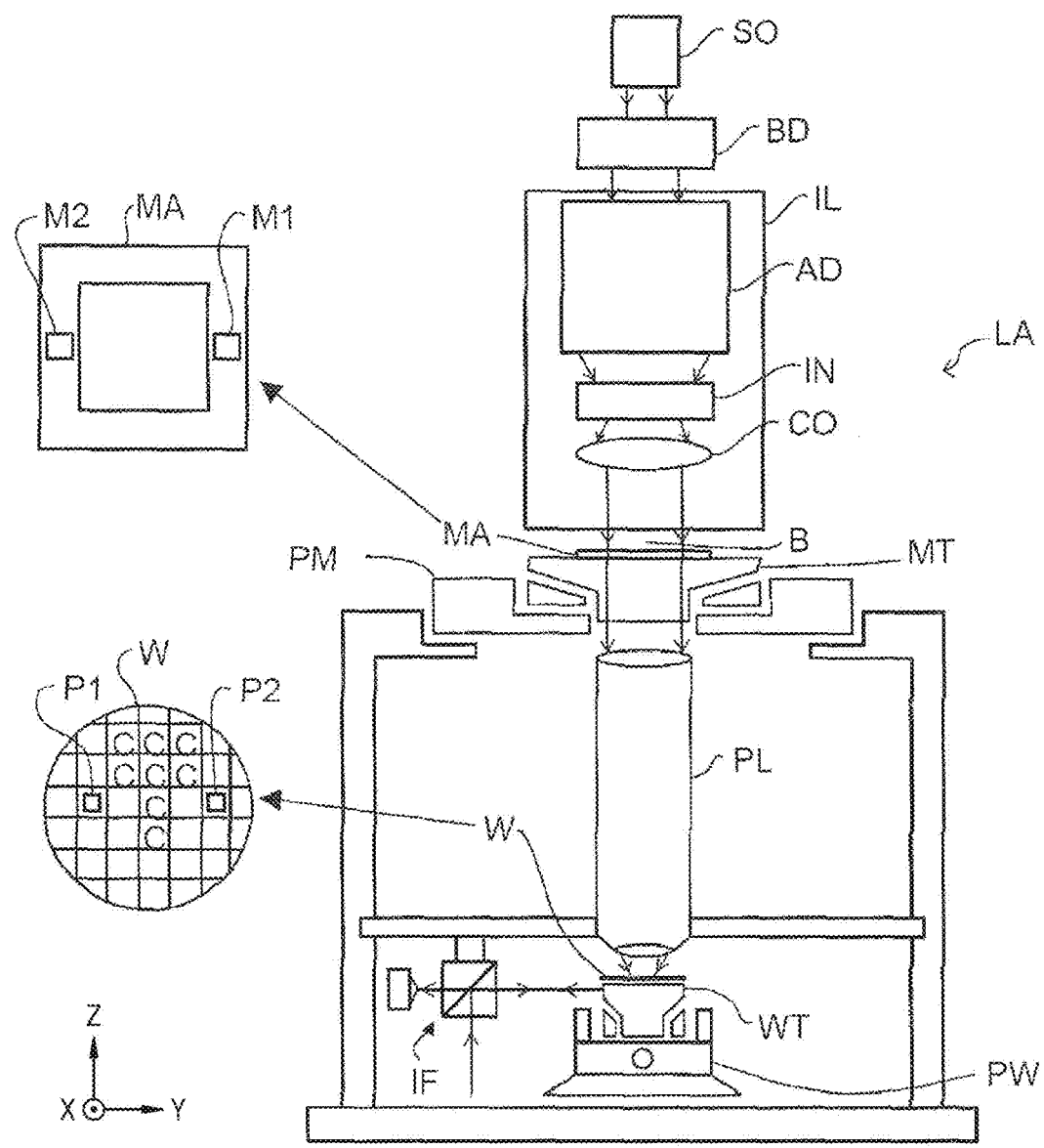
FIG. 1 is a cross-sectional view schematically illustrating a lithography apparatus that may be used in a method of manufacturing a semiconductor device, according to some example embodiments.

Hereinafter, some example embodiments will be described below in more detail with reference to the accompanying drawings. Like reference numerals are used for like elements in the drawings, and a redundant description thereof will be omitted.

FIG. 1 is a cross-sectional view schematically illustrating a lithography apparatus LA that may be used to perform a method of manufacturing a semiconductor device and a monitoring process according to some example embodiments.

The lithography apparatus LA may include a source SO, an illuminator IL, a patterning device MA, a first positioning unit PM, a mask table MT, a second positioning unit PW, a wafer table WT, and a projection system PL. According to some example embodiments, operations described herein as being performed by any or all of the lithography apparatus LA, the source SO, the illuminator IL, the patterning device MA, the first positioning unit PM, the mask table MT, the second positioning unit PW, the wafer table WT, the projection system PL, the beam-transmitting system BD, the adjuster AD, and/or the position sensor IF may be performed under the control of at least one processor (e.g., a track control unit TCU, a supervisory control system SCS, and/or a lithography control unit LACU) executing program code that includes instructions corresponding to the operations. The instructions may be stored in a memory (e.g., a memory of the lithography apparatus LA). The term 'processor,' as used in the present disclosure, may refer to, for example, a hardware-implemented data processing device having circuitry that is physically structured to execute desired operations including, for example, operations represented as code and/or instructions included in a program. In at least some example embodiments the above-referenced hardware-implemented data processing device may include, but is not limited to, a microprocessor, a central processing unit (CPU), a processor core, a multi-core processor; a multiprocessor, an application-specific integrated circuit (ASIC), and a field programmable gate array (FPGA).

Here, two directions that are parallel or substantially in parallel to a top surface of a wafer W placed inside the lithography apparatus LA and substantially perpendicular to each other, are defined as first and second directions (X-direction and Y-direction). Also, a direction that is perpendicular or substantially perpendicular to the top surface of the wafer W is defined as a third direction (Z-direction). Definitions of the directions also apply to all of the following drawings unless otherwise noted.

The source SO may emit ultraviolet rays (UVs), excimer laser beams, extreme ultraviolet (EUV) lights, and/or radioactive beams B, such as X-rays and/or electron rays. According to some example embodiments, the source SO may be a part of components of the lithography apparatus LA or a separate component. When the source SO is an excimer laser, the source SO may be a separate component from the lithography apparatus LA. In this case, the radioactive beams B may be transmitted from the source SO to the illuminator IL using a beam-transmitting system BD including a beam expander. When the source SO is a mercury (Hg) lamp, the source SO may be included in the lithography apparatus LA.

The illuminator IL may accommodate the radioactive beams B from the source SO. The illuminator IL may orient the direction of the radioactive beams B towards a set (e.g., determined and/or desired) direction, and/or form and/or control the shape of the radioactive beams B. In some example embodiments, the illuminator IL may include optical components having various shapes, such as a refraction type, a reflection type, a magnetic type, an electromagnetic type, and/or combinations thereof. The illuminator IL may include an adjuster AD for adjusting intensity distribution according to an angle of the radioactive beams B. The adjuster AD may adjust the size of an outer radius and/or an inner radius of intensity distribution of a pupil plane of the illuminator IL. The illuminator IL may adjust the radioactive beams so that the cross-section of the radioactive beams B has certain uniformity and/or intensity distribution.

The mask table MT may support the patterning device MA. The mask table MT may use mechanical, vacuum type, electrostatic, and/or a variety of clamping technologies. In some example embodiments, the mask table MT may be a fixed frame and/or table. In some example embodiments, the mask table MT may be a movable frame and/or table. The mask table MT may situate the patterning device MA to a set position with respect to the projection system PL. The radioactive beams B may be incident onto the patterning device MA supported by the mask table MT. The shape of the cross-section of the radioactive beams B incident onto the patterning device MA may be changed to a shape set by the patterning device MA. The projection system PL may include a refraction type, a reflection type, a catadioptric type, a magnetic type, an electromagnetic type, an electrostatic optical type, and/or a combination of at least some thereof.

In some example embodiments, the patterning device MA may be a transmission type and/or reflection type. The patterning device MA may be one or more among a mask, a programmable mirror array, and/or a programmable liquid crystal display (LCD) pattern, for example. When the patterning device MA is a mask type, the patterning device MA may be one or more among a binary type, an alternation phase-shift type, an attenuation phase-shift type, and/or various hybrid types. However, some example embodiments are not limited thereto.

When the patterning device MA is a programmable mirror array, the patterning device MA may include a set of small mirrors placed in the form of a matrix, for example. Each of the small mirrors included in the patterning device MA may be individually inclined so as to reflect the radioactive beams B incident onto the small mirrors in different directions. Each of the small, inclined mirrors may form patterns in (e.g., from) the radioactive beams B reflected by a mirror matrix.

Subsequently, the radioactive beams B may pass through the projection system PL. The projection system PL may focus the radioactive beams B onto a target portion C of the wafer W. In some example embodiments, the second positioning unit PW and/or a position sensor IF may drive the wafer table WT so that the radioactive beams B may be sequentially focused onto the target portion C of the wafer W placed on the wafer table WT. Referring to FIG. 1, the lithography apparatus LA includes one wafer table WT and a second positioning unit PW. However, some example embodiments are not limited thereto. The lithography apparatus LA may include a plurality of (for example, two) wafer tables and a second positioning unit PW. In this case, wafers placed on different wafer tables may be alternately and/or sequentially exposed.

In some example embodiments, the second positioning unit PW may drive the wafer table WT so as to realize designed circuit patterns. In some example embodiments, the second positioning unit PW may drive the wafer table WT so that the radioactive beams B may be focused in a set position of the wafer W. The set position of the wafer W may be defined from a model function calculated using wafer alignment marks P1 and P2. Here, the model function may be a function of positions identified by the wafer alignment marks P1 and P2 and/or a function of an identified position of a certain component of the wafer from the identified positions. The second positioning unit PW may drive the wafer table WT so that a layer to be formed on the wafer W using a lithography process may be aligned with an underlying layer and thus a normally-operating semiconductor device may be formed.

In some example embodiments, a space between the projection system PL and the wafer W may be filled with liquid having a high refractive index, like water. According to some example embodiments, at least a part of the wafer W may be covered by the liquid. The liquid is referred to as an immersion liquid. The immersion liquid may be filled in other spaces in the lithography apparatus, like a space between the patterning device MA and the projection system PL, for example. In this case, immersion may mean that not only the wafer W is immersed into the liquid but also the immersion liquid is on a path of the radioactive beams B for performing exposure.

The patterning mask MA drawn from a mask library may be precisely moved by the first positioning unit PM and/or an additional position sensor so that the patterning mask MA may be placed on a path of the radioactive beams B while an exposure process is performed.

When the lithography apparatus LA operates in a step mode, the mask table MT and the wafer table WT may remain stationary, and all the patterns set to the radioactive beams B may be projected onto the target portion C. The patterning device MA and the wafer W may be aligned using mask alignment marks M1 and M2 formed on the patterning device MA and substrate-aligning marks P1 and P2 (also referred to herein as wafer alignment marks P1 and P2) formed on the wafer W. Here, the target portion C may be a full shot or a part of a shot, as described with reference to FIGS. 3 and 4. Thereafter, the wafer table WT may be moved (e.g., in a horizontal direction with respect to the top surface of the wafer W) so that another target portion C may be exposed. In the step mode, the size (e.g., the maximum size) of an exposure field may define the size of the target portion C to be imaged during exposure.

When the lithography apparatus LA operates in a scan mode, the mask table MT and the wafer table WT may be synchronized with each other while the radioactive beams B are projected onto the target portion C so that the mask table MT and the wafer table WT may make a relative motion with respect to each other. The speed and/or direction of the relative motion of the wafer table WT with respect to the mask table MT may be determined by enlargement (or reduction) of the projection system PL, image inversion characteristics, etc. In the scan mode, the size (e.g., the maximum size) of the exposure field may limit the width of the horizontal direction of the target portion C during exposure.

When the patterning device MA is a programmable patterning device (e.g. a programmable mirror array and/or a programmable LCD panel), the mask table MT may remain stationary, and the wafer table WT may be moved and/or scanned so that the radioactive beams B may be focused onto the target portion C during the exposure process. In this case, the radioactive beams B may be a pulsed source. The patterning device MA may be updated so as to set a new cross-section in the radioactive beams B according to movement of the wafer table WT.

Figure 2:
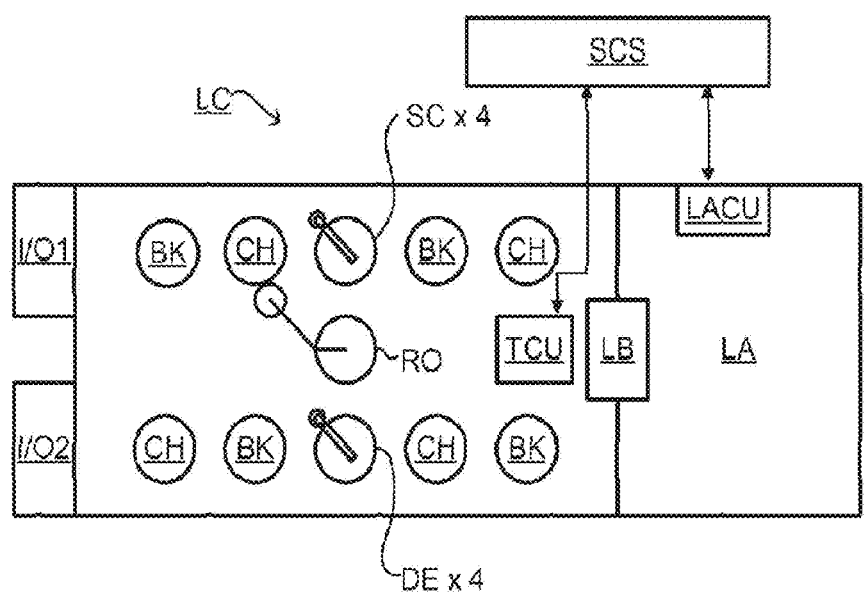
FIG. 2 is a schematic plan view illustrating a lithography cell or cluster including the lithography apparatus of FIG. 1.

FIG. 2 is a schematic plan view illustrating a lithography cell and/or cluster.

Referring to FIG. 2, the lithography apparatus LA described with reference to FIG. 1 may be included in a lithography cell LC that is also called a lithocell and/or cluster.

The lithography cell LC may include an apparatus for performing processes before and/or after exposure on the wafer W. The lithography cell LC may include process apparatuses including a plurality of (for example, four) spin coaters SC for coating photoresist material layers, a plurality of (for example, four) developers DE for developing an exposed resist (e.g., an exposed photoresist material layer), a chill plate CH, and/or a bake plate BK.

A handler robot RO may pick up wafers from input/output ports I/O1 and/or I/O2 and may move the wafers between different process apparatuses. The handler robot RO may transmit (e.g., transport) the wafers on which the processes are performed, to a loading bay LB of the lithography apparatus LA. The handler robot RO, the input/output ports I/O1 and I/O2, and the loading bay LB may be referred to as a transfer track.

A track control unit TCU may control operations of the handler robot RO, the input/output ports I/O1 and I/O2, and the loading bay LB. The track control unit TCU may be controlled by a supervisory control system SCS. The supervisory control system SCS may be controlled by a lithography control unit LACU. According to some example embodiments, operations described herein as being performed by any or all of the lithography cell LC, the spin coaters SC, the developers DE, the chill plate CH, the bake plate BK, the handler robot RO, the input/output ports I/O1 and/or I/O2, and/or the loading bay LB may be performed under the control of at least one processor (e.g., a track control unit TCU, a supervisory control system SCS, and/or a lithography control unit LACU) executing program code that includes instructions corresponding to the operations. The instructions may be stored in a memory (e.g., a memory of the lithography apparatus LA and/or of the lithography cell LC).

In order to precisely and/or consistently expose the wafers, characteristics such as an overlay between subsequent layers, a line thickness, and/or a critical dimension (CD), may be inspected. When inspection is performed before different wafers of the same batch or a similar batch are completely exposed, an exposure process of the subsequent wafers may be adjusted using the result of inspection. Exposed wafers may be subjected to a coating and/or exposure process again after removing the exposed resist layer, and/or may be discarded to improve the yield. When there are defects in a part of some (e.g., one or more) target portions of the exposed wafers, additional exposure may be performed on the defective target portions.

In some example embodiments, the lithocell LC may further include an inspection apparatus for determining characteristics of the wafers and/or distribution of the characteristics between wafers, between lots and/or between different layers of the same wafer or a similar wafer. However, some example embodiments are not limited thereto, and the inspection apparatus may be included in the lithography apparatus LA or a separate apparatus from the lithocell LC and the lithography apparatus LA. The inspection apparatus may include (e.g., may be) an inspection apparatus that will be described later with reference to FIG. 10.

In some example embodiments, the inspection apparatus may inspect a photoresist material layer immediately and/or promptly after exposure is performed. In this case, a difference between refractive indexes of exposed portions and unexposed portions of the photoresist material layer may be small. Thus, a latent image of the photoresist material layer before development has low contrast. In some example embodiments, post exposure bake (POB), in which contrast between the exposed portions and the unexposed portions of the photoresist material layer is increased before inspection is performed, may be performed. In some example embodiments, after the exposed portions or the unexposed portions of the photoresist material layer are removed, inspection may be performed. In some example embodiments, after patterns formed on the photoresist material layer may be transferred onto the underlying layer by performing processes, such as etching, ashing, and/or lift-off, the underlying layer may be inspected.

Figure 3:
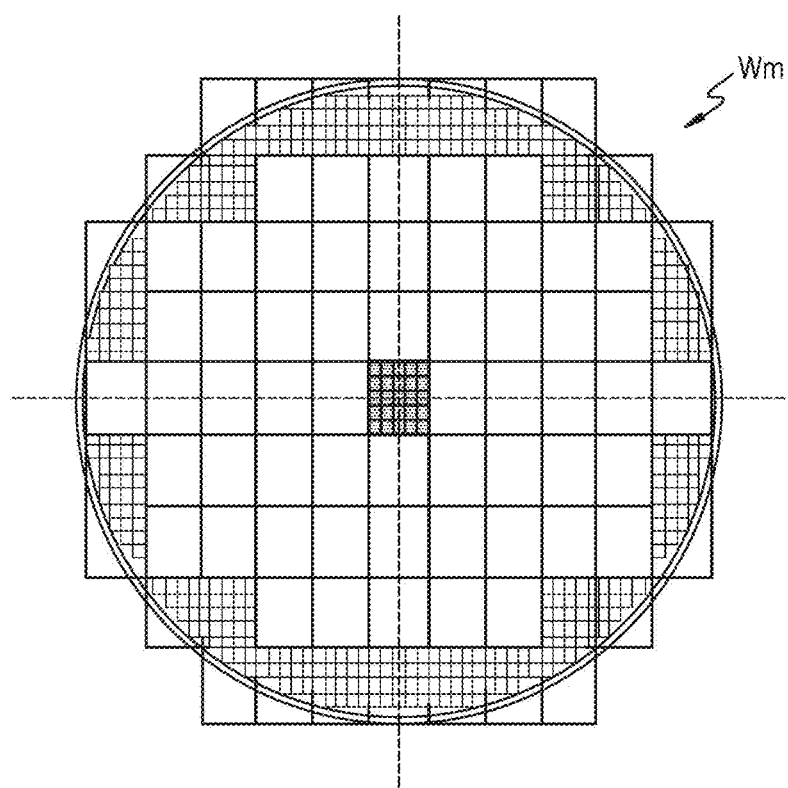
FIGS. 3 and 4 are plan views illustrating the configuration of full shots of the inside of a wafer of each of a memory chip and a logic chip and chips that may be manufactured according to some example embodiments.
Figure 4:
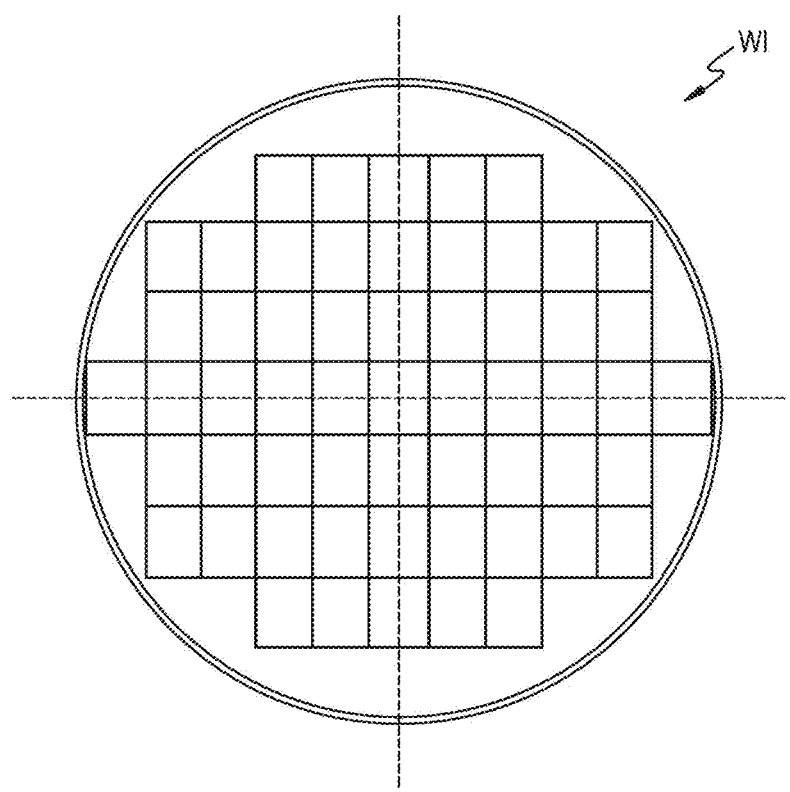

FIGS. 3 and 4 are plan views illustrating the configuration of full shots of the inside of a wafer of each of a memory chip and a logic chip and chips. More specifically, FIG. 3 illustrates a wafer of the memory chip, and FIG. 4 illustrates a wafer of the logic chip.

Referring to FIG. 3, in a wafer Wm of the memory chip, a plurality of memory chips may be included in one full shot. For example, 25 memory chips may be included in one full shot. In some example embodiments, 87 shots or scanning may be performed so as to pattern the wafer Wm of one memory chip entirely. In FIG. 3, a shot is illustrated as a large square, and the memory chip is illustrated as a small square.

The number of full shots among the 87 shots may be 57, and these full shots are indicated by large squares within the wafer Wm. In this case, shots at an outer portion of the wafer Wm do not constitute a full shot. Thus, when an exposure process is performed on the outer portion of the wafer Wm, only a part of the mask pattern may be transferred onto the wafer Wm. A full shot is not transferred onto the outer portion of the wafer Wm. However, patterns used to realize the memory chip may be transferred through partial transfer of the set patterns. Thus, memory chips formed at the outer portion of the wafer Wm that are effective chips may be utilized in a product.

Referring to FIG. 4, in the case of a wafer W1 of the logic chip, one logic chip may correspond to one full shot. In the case of the wafer W1 of the logic chip, 57 full shots may be included. Because an outer portion of the wafer W1 of the logic chip does not constitute one full logic chip, unlike in a memory chip, exposure may not performed on the outer portion of the wafer W1 of the logic chip.

Figure 5:
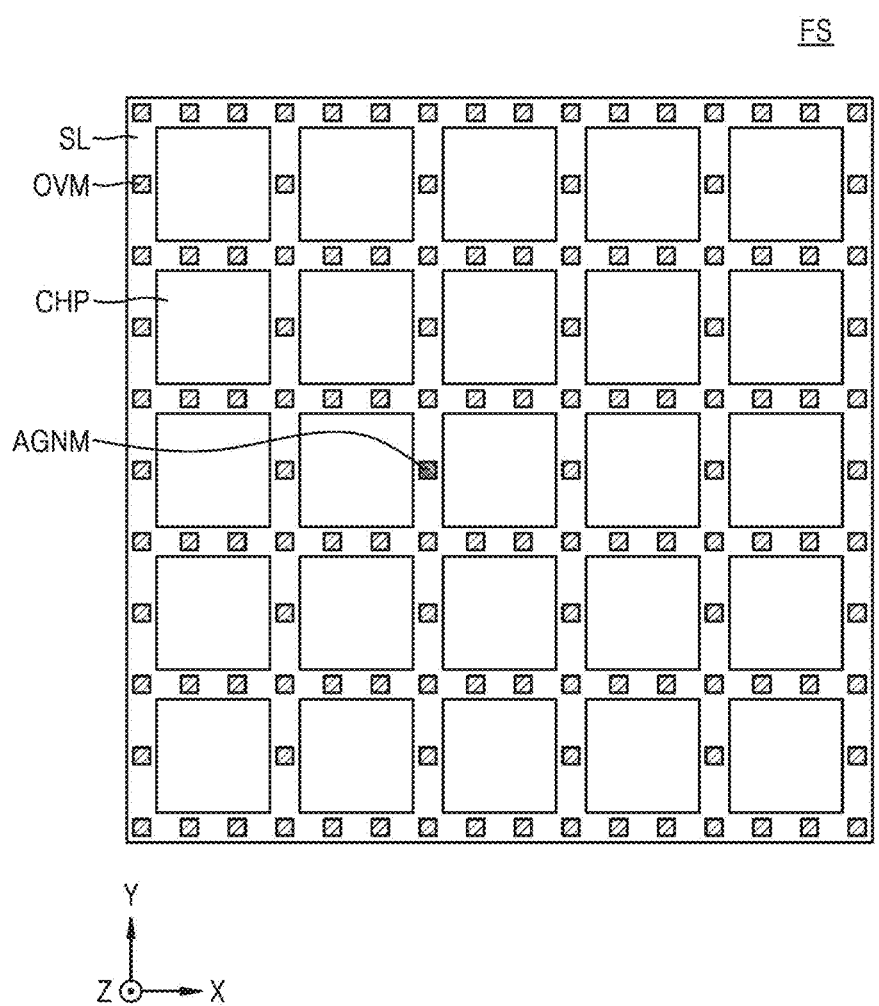
FIG. 5 is a plan view illustrating a method of manufacturing a semiconductor device, according to some example embodiments.

FIG. 5 is a plan view illustrating an image of a full shot FS during an EUV exposure process. FIG. 5 corresponds to the full shot FS for forming the memory chip illustrated in FIG. 3, and a description given with reference to FIG. 5 may apply to the logic chip of FIG. 4 in a similar manner.

Referring to FIG. 5, in an exposure process, the full shot FS may correspond to all the mask patterns that may be transferred onto a wafer through one scanning. Meanwhile, generally, the EUV exposure process may be performed by reduced-size projection, for example, reduced-sized projection of 4:1, for example. Thus, patterns formed in a patterning device, such as the mask patterns, may be reduced to the size of ¼ and transferred onto the wafer. Here, ¼ is a reduction ratio of a length, and the area may be reduced to the size of ¹⁄₁₆. In some example embodiments, the full shot FS may have the size of about 26 mm in the X-axis direction and the size of about 33 mm in the Y-axis direction. However, some example embodiments are not limited thereto.

The full shot FS may include chips CHP and a scribe lane SL. The scribe lane SL may extend between the chips CHP and may separate the chips CHP from each other. The scribe lane SL may be a separation line for separating the chips CHP into individual semiconductor chips in a sawing process.

In some example embodiments, the chips CHP may be memory devices. In some example embodiments, the chips CHP may be non-volatile memory devices. In some example embodiments, the chips CHP may be non-volatile Not AND (NAND)-type flash memory. In some example embodiments, the chips CHP may be one among phase-change random access memory (PRAM), magnetic random access memory (MRAM), resistive random access memory (ReRAM), ferroelectric random access memory (FRAM), and/or a NOR flash memory. In addition, the chips CHP may be volatile memory devices in which data is lost when power is cutoff, like in dynamic random access memory (DRAM) and/or static random access memory (SRAM).

In FIG. 5, 25 chips are formed in one full shot FS. However, this is just an example for explanation and does not limit the technical spirit of some example embodiments in any sense. Chips of various numbers and/or sizes may be included in one full shot FS according to the type and/or specifications of a device to be formed, and this also applies to FIG. 3.

In some example embodiments, for example, the chips CHP may be one among a logic chip and/or a measurement device, a communication device, a digital signal processor (DSP), and/or a system-on-chip (SOC).

Also, in FIG. 5, the chips CHP approximately have a square profile. However, some example embodiments are not limited thereto. For example, the chips CHP may be driver-driving integrated circuit (IC) chips. In this case, one-facing sides of the chips CHP may be longer than other facing sides that are perpendicular thereto.

In some example embodiments, an alignment mark AGNM and/or an overlay mark OVM may be further formed on the full shot FS. In some example embodiments, the alignment mark AGNM and/or the overlay mark OVM are formed on the scribe lane SL. However, some example embodiments are not limited thereto. For example, some of the alignment mark AGNM and/or the overlay mark OVM may be formed in the chips CHIP (e.g., on one or more of the chips CHIP).

In some example embodiments, the alignment mark AGNM may be a pattern used to precisely set an exposure region in a lithography process. In some example embodiments, the alignment mark AGNM may be disposed adjacent to the center of the full shot FS. However, some example embodiments are not limited thereto. Referring to FIG. 5, one full shot FS includes one alignment mark AGNM. However, some example embodiments are not limited thereto. For example, two or more alignment marks AGNM may be disposed in a part of the full shot FS. Also, the alignment mark AGNM in a part of the full shot FS may be omitted. In some example embodiments, the alignment mark AGNM may be the same or substantially the same as wafer-alignment marks P1 and P2 described in FIG. 1.

In some example embodiments, the overlay mark OVM may be a pattern for measuring interlayer consistency between a layer formed in the previous process and a layer formed in a current process. Here, interlayer consistency may include, for example, an alignment state between adjacent layers and/or the occurrence of circuit defects, such as a short-circuit and/or opening. The overlay mark OVM may be disposed denser than the alignment mark AGNM.

Marks having various functions may be additionally provided to the full shot FS. For example, a mark for electrically testing characteristics of a completed semiconductor device, a mark for measuring the thickness of an uppermost layer after a chemical-mechanical polishing (CMP) process is performed, and/or a mark for optically measuring a critical line width and/or an inside thickness, may be additionally provided to the full shot FS.

Figure 6A:
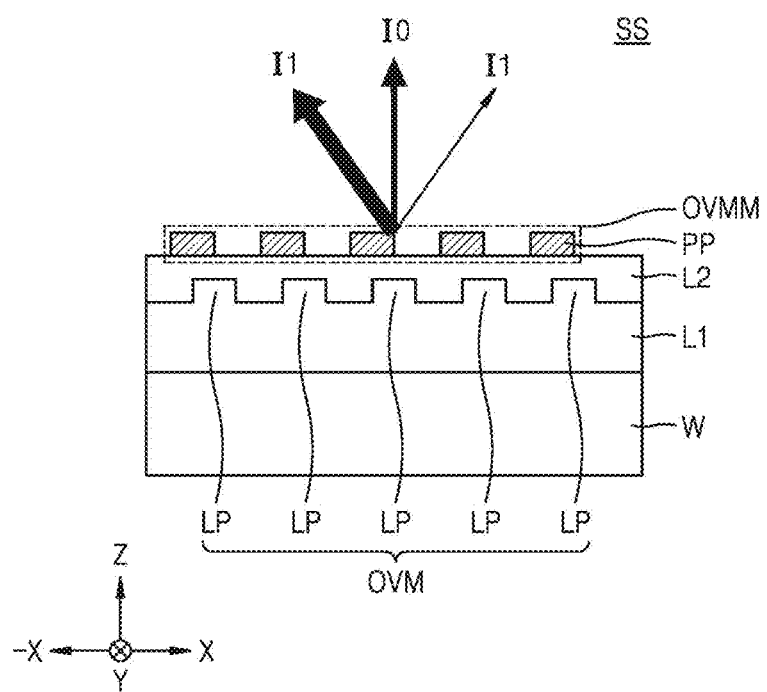
FIGS. 6A through 6C are conceptual views illustrating a diffraction-based overlay (DBO) technology.
Figure 6B:
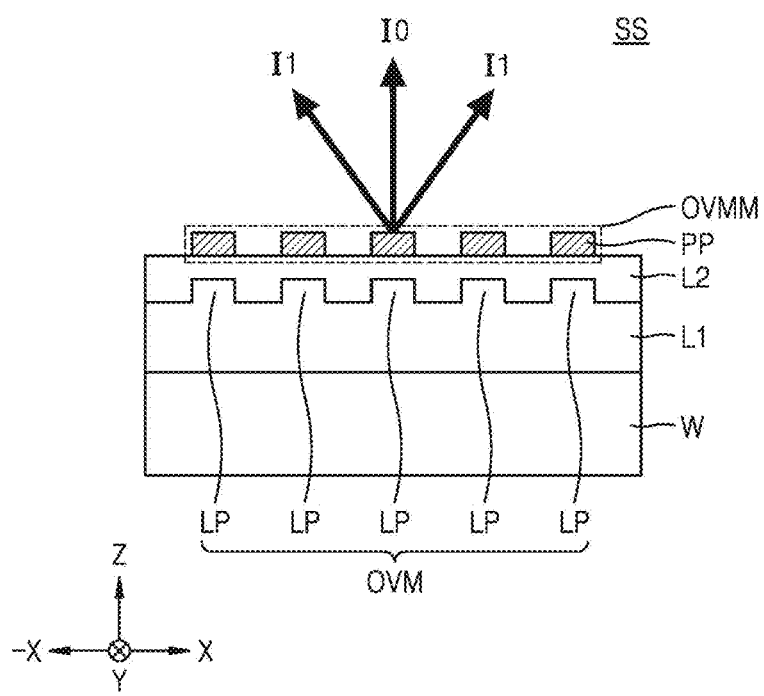
Figure 6C:
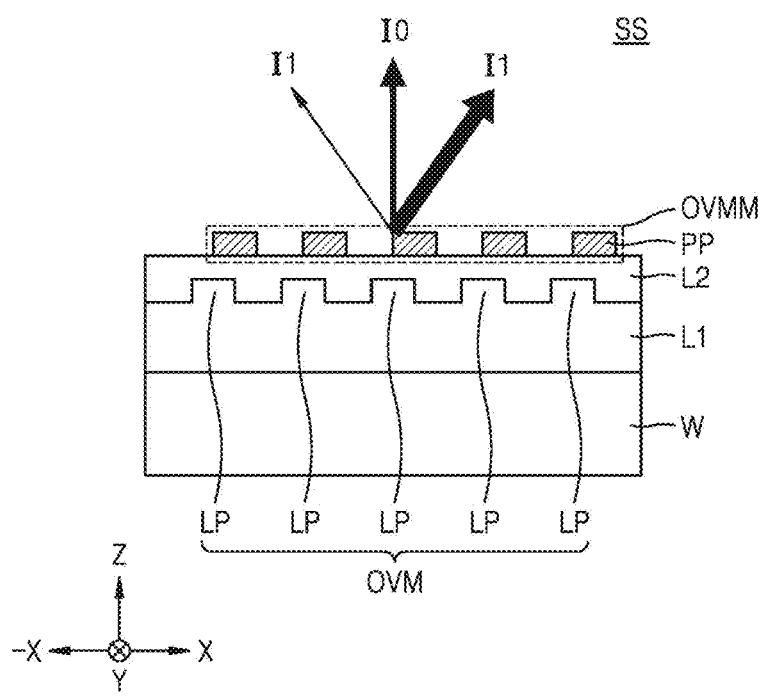

FIGS. 6A through 6C are conceptual views for explaining diffraction-based overlay (DBO) technology. FIGS. 6A through 6C illustrate an overlay mark of a semiconductor structure and a part in which a mold of the overlay mark is formed.

For convenience, only in FIGS. 6A through 6C, a direction in anti-parallel (e.g., parallel to each other but pointing in the opposite direction) to the first direction (X-direction) is restrictively referred to as a negative first direction (−X direction).

Referring to FIGS. 6A through 6C, a semiconductor structure SS may include a wafer W, a first layer L1, a second layer L2, and/or a photoresist pattern PP.

The first layer L1 may be disposed on the wafer W, the second layer L2 may be disposed on the first layer L1, and the photoresist pattern PP may be disposed on the second layer L2. Referring to FIG. 7, the wafer W and the first layer L1 are in contact with each other. However, some example embodiments are not limited thereto. For example, other layers may be between the wafer W and the first layer L1.

In some example embodiments, the first layer L1 and the second layer L2 may be layers that may be optically distinguished from each other. For example, the first layer L1 may be a conductive layer, and the second layer L2 may be an insulating layer. In another example, the first layer L1 may be an insulating layer, and the second layer L2 may be a conductive layer. In another example, for example, the first and second layers L1 and L2 may be insulating layers having different refractive indexes or conductive layers having different reflectivity. In some example embodiments, the first layer L1 and the second layer L2 may each have a single-layer structure or a multi-layer structure including a plurality of layers. In some cases, the second layer L2 may include a hard mask layer including amorphous carbon.

In some example embodiments, the first layer L1 may include one or more overlay marks OVM. In some example embodiments, the overlay mark OVM may have a shape of a line and space. In some example embodiments, the overlay mark OVM may constitute an optical grating structure.

In some example embodiments, the overlay mark OVM may include one or more line patterns LP. In some example embodiments, the line patterns LP may be apart from one another in the first direction (X-direction) and may extend in the second direction (Y-direction). In some example embodiments, the line patterns LP may constitute the structure of the line and space. In FIGS. 6A through 6C, the line patterns LP extend in the second direction (Y-direction). However, some example embodiments are not limited thereto. For example, the line patterns LP may extend in the first direction (X-direction) or in an oblique direction with respect to the first and second directions (X-direction and Y-direction).

In some example embodiments, the photoresist pattern PP may include an overlay mark mold OVMM. In some example embodiments, the overlay mark mold OVMM may have a shape of a line and space. In some example embodiments, the overlay mark mold OVMM may constitute an optical grating structure. According to some example embodiments, the overlay mark mold OVMM (also referred to herein as a plurality of overlay molds) may be formed (e.g., under the control of the at least one processor) by developing a photoresist material layer (e.g., of the photoresist pattern PP).

Referring to FIGS. 6A through 6C, a plurality of lights diffracted by the overlay mark OVM and the overlay mark mold OVMM are shown as arrows. Here, thicknesses of the arrows may denote intensity of each of the plurality of lights.

The plurality of lights may include zero-order diffracted light I0 and first-order diffracted lights I1. The first-order diffracted lights I1 may be detected in opposite positions centering on the zero-order diffracted light I0.

In FIG. 6A, the overlay mark mold OVMM is biased (or deviated) to the negative first direction (−X direction) in the drawings compared to the overlay mark OVM. In this case, the intensity of the first-order diffracted light I1 that is oriented toward the negative first direction (−X direction) may be greater than the intensity of the first-order diffracted light I1 that is oriented toward the positive first direction (X-direction). In FIG. 6B, the overlay mark OVM and the overlay mark mold OVMM are aligned with each other. Thus, intensities of the first-order diffracted lights I1 may be the same or substantially the same. In FIG. 6C, the overlay mark mold OVMM is biased (or deviated) to the positive first direction (X-direction) compared to the overlay mark OVM. Thus, the intensity of the first-order diffracted light I1 that is oriented toward the positive first direction (X-direction) may be greater than the intensity of the first-order diffracted light I1 that is oriented toward the negative first direction (−X direction).

As described above, the DBO is a technique of calculating the overlay, The DBO technology refers to a technology calculating the overlay, which is an error of the interlayer consistency, by comparing intensities of the first-order diffracted lights I1 of the light diffracted by the overlay mark template OVMM and the overlay mark OVM.

FIGS. 7A through 7D are conceptual views illustrating DBO technology according to a comparative example.

Referring to FIGS. 7A through 7D, the shape of a line pattern LP that may be included in the overlay mark OVM (see FIG. 6A) and the shape of a photoresist pattern PP that may be included in the overlay mark mold OVMM are shown. Generally, the patterns LP/PP may not have an exactly or sufficiently rectangular lattice grating shape due to a process error.

Figure 7A:
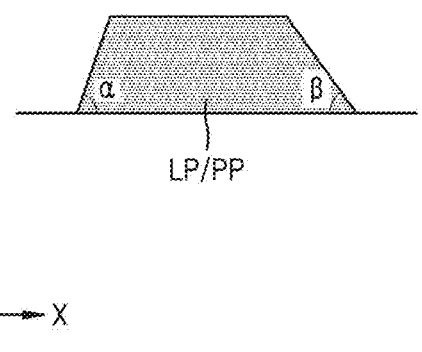
FIGS. 7A through 7D are conceptual views illustrating DBO technology according to a comparative example.
Figure 7B:
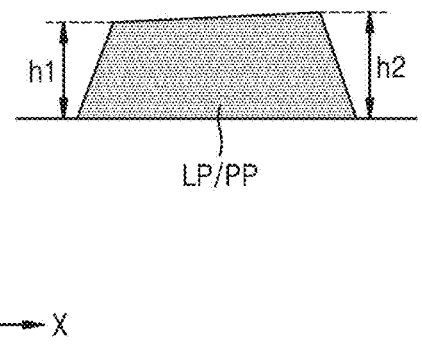
Figure 7C:
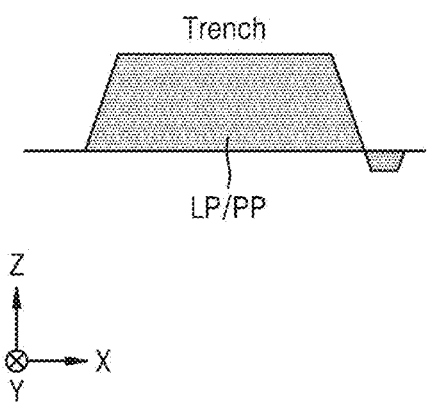
Figure 7D:
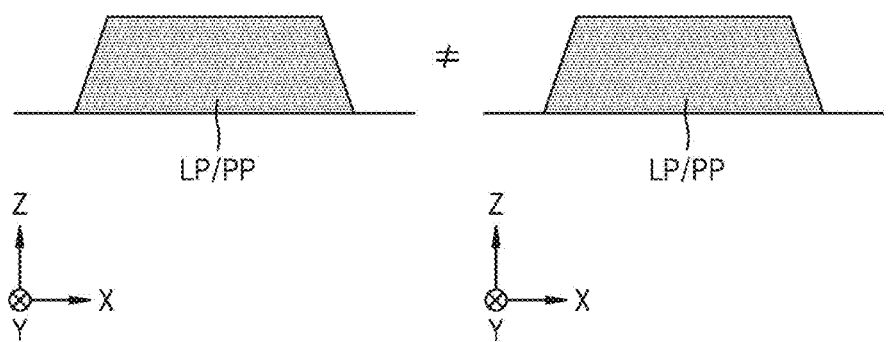

More specifically, referring to FIG. 7A, a first inclination α and a second inclination β that are inclinations of opposite sidewalls of the patterns LP/PP may be different from each other. Thus, the sidewalls of the patterns LP/PP may have asymmetric structures. Referring to FIG. 7B, a first height h1 and a second height h2 that are heights of the opposite sidewalls of the patterns LP/PP may be different from each other. Thus, the sidewalls of the patterns LP/PP may have asymmetric structures. Referring to FIG. 7C, trenches may be formed adjacent to the patterns LP/PP. This may have an asymmetric impact on diffraction of light. Referring to FIG. 7D, shapes of the adjacent patterns LP/PP may be different from each other.

Referring back to FIGS. 6A through 6C, theoretically, DBO technology has measurement accuracy irrelevant to spatial resolution of a measurement apparatus. However, the DBO technology assumes that the overlay mark OVM and the overlay mark mold OVMM have ideal and/or desired grating structures. Thus, the DBO technology is vulnerable to deformation of the overlay mark OVM and the overlay mark mold OVMM. More specifically, the first-order diffracted lights I1 with respect to the overlay mark OVM and the overlay mark mold OVMM may be effected by relative positions of the overlay mark OVM and the overlay mark mold OVMM and distortion of the shapes of the patterns PP and LP that constitute the overlay mark OVM and the overlay mark mold OVMM. Thus, the DBO technology has disadvantages that error measurement due to the systematic process error occurs inevitably.

Figure 8:
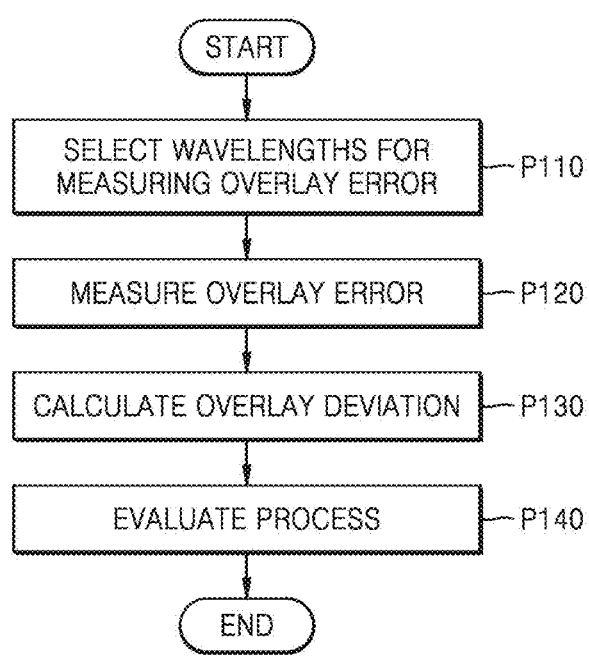
FIG. 8 is a flowchart illustrating a process-monitoring method according to some example embodiments.

FIG. 8 is a flowchart illustrating a method of manufacturing a semiconductor device, according to some example embodiments. Any or all of the operations described as being performed in association with the method of manufacturing a semiconductor device as illustrated in FIG. 8 (e.g., operations P110, P120, P130 and/or P140) may be performed by at least one processor (e.g., the track control unit TCU, the supervisory control system SCS, and/or the lithography control unit LACU) executing program code that includes instructions corresponding to the operations. The instructions may be stored in a memory.

Figure 9A:
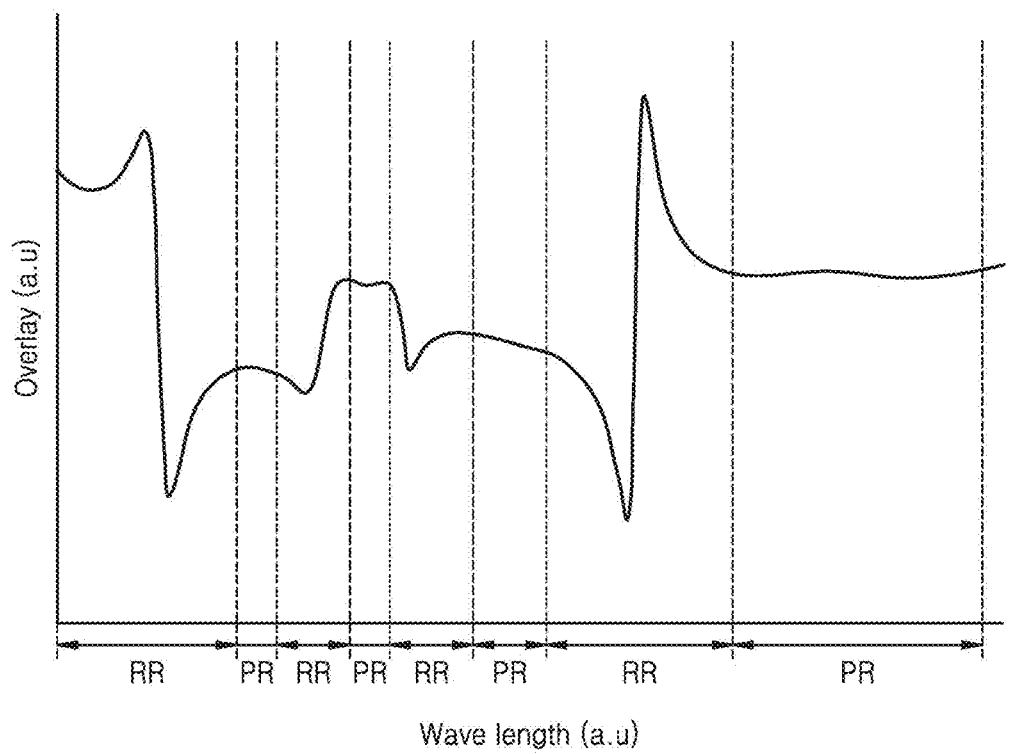
FIGS. 9A and 9B are graphs illustrating a method of manufacturing a semiconductor device, according to some example embodiments.
Figure 9B:
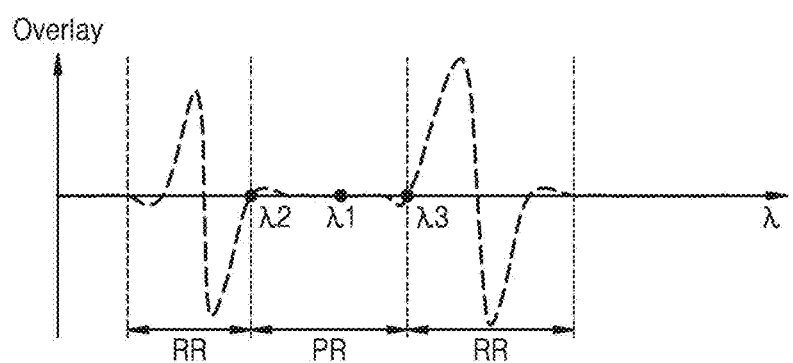

FIGS. 9A and 9B are graphs illustrating a method of manufacturing a semiconductor device, according to some example embodiments. More specifically, FIG. 9A is a graph showing an example of measurement of an overlay spectrum that will be described later, and FIG. 9B is a graph showing an overlay spectrum simplified for explanation.

Referring to FIGS. 8 through 9B, in operation P110, wavelengths for measuring an overlay may be selected (e.g., by the at least one processor). In some example embodiments, selecting of the wavelengths for measuring an overlay may include providing an overlay spectrum, determining a plateau region PR of the overlay spectrum, and/or selecting of the wavelengths for measuring the overlay. Here, the overlay spectrum that is a so-called landscape means a value of the overlay (e.g., a plurality of determined overlay values based on the overlay mark(s) and/or overlay mark mold(s) of the semiconductor structure) according to wavelengths. According to some example embodiments, overlay values corresponding to a series of wavelength values or a continuous waveband may be measured in a preparatory operation before the semiconductor device manufacturing process. However, some example embodiments are not limited thereto. The overlay spectrum may be called (e.g., retrieved and/or accessed) from a data table of the overlay spectrum obtained in an existing process.

The plateau region PR means a wavelength region in which a change of the overlay spectrum according to wavelengths is relatively small. A portion in which the change of the overlay spectrum according to wavelengths is relatively large, is referred to as a resonance region RR. In some example embodiments, the plateau region PR may be determined based on a value of a second partial derivative differentiation function with respect to wavelengths of the overlay spectrum. In some example embodiments, the plateau region PR may be a wavelength band that satisfies the following Equation 1:

$$\frac{\partial^2 OVE(\lambda)}{\partial \lambda^2} \leq CT, \quad (1)$$

where $\lambda$ is a wavelength, $OVE(\lambda)$ is a function of an overlay according to wavelengths, and CT is a set (e.g., determined and/or desired) critical value. According to some example embodiments, the plateau region PR may be determined a region of the overlay spectrum for which a second partial derivative of a function representing the overlay spectrum with variable wavelength is smaller than a set value. For example, the set value may be a design parameter determined through empirical study. In some example embodiments, when the overlay spectrum with respect to a series of discrete wavelength values is measured, differentiation may be performed after the overlay spectrum is fitted to a continuous function using any of known fitting technology. However, some example embodiments are not limited thereto.

In some example embodiments, obtaining the plateau region PR from the overlay spectrum may be performed by comparing a first-order differentiation function with a set critical value, as shown in Equation 2:

$$\frac{\partial OVE(\lambda)}{\partial \lambda} \leq CT', \quad (2)$$

where CT' is a set critical value.

In some example embodiments, obtaining of the plateau region PR of the overlay spectrum may be performed on each different overlay mark, that is, each overlay mark horizontally apart from one another. In some example embodiments, obtaining of the plateau region PR of the overlay spectrum may be performed using an average value of different overlays.

In some example embodiments, selecting of the wavelengths for measuring the overlay may include selecting of a plurality of wavelengths in the plateau region PR. At least one of the wavelengths for measuring the overlay may be one among both end values of the plateau region PR. Referring to FIG. 9B, the wavelengths for measuring the overlay may include first through third wavelengths $\lambda 1$, $\lambda 2$, and $\lambda 3$. The second and third wavelengths $\lambda 2$ and $\lambda 3$ may be both end values of the plateau region PR. The first wavelength $\lambda 1$ may be a value between the second and third wavelengths $\lambda 2$ and $\lambda 3$. In some example embodiments, the first wavelength $\lambda 1$ may be longer than the second wavelength $\lambda 2$ and may be shorter than the third wavelength $\lambda 3$. In some example embodiments, the first wavelength $\lambda 1$ may be a middle value or approximately be a middle value of the second and third wavelengths $\lambda 2$ and $\lambda 3$ such as an arithmetic average or a geometric average of the second and third wavelengths $\lambda 2$ and $\lambda 3$. However, some example embodiments are not limited thereto.

In FIG. 9B, three wavelengths for measuring an overlay are selected. However, some example embodiments are not limited thereto. For example, the first and second wavelengths $\lambda 1$ and $\lambda 2$ may be selected as wavelengths for measuring an overlay, or the first and third wavelengths $\lambda 1$ and $\lambda 3$ may be selected as wavelengths for measuring an overlay. In another example, four or more wavelengths for measuring an overlay may be selected in one plateau region PR.

At least one of the wavelengths for measuring an overlay may be insensitive and/or less sensitive with respect to the process error. As will be described later, the process error has a tendency that the overlay spectrum may make a parallel translation to the left and right or the amplitude of the resonance region RR may be increased. In some example embodiments, at least one wavelength among the wavelengths for measuring the overlay may be selected so that, even when the overlay spectrum of the plateau region PR may make a parallel translation to the left and right, at least one wavelength from the center may be still placed in the plateau region PR. Thus, the wavelengths for measuring an overlay for providing the overlay value that changes insensitively with respect to the process error, may be selected so that reliability of measurement of the overlay may be improved.

The plateau region PR determined by Equation 1 and/or Equation 2 may be plural, as shown in FIG. 9A. In some example embodiments, the wavelengths for measuring the overlay may be selected from a single plateau region PR. In this case, the width of at least one of a plurality of plateau regions PR from which wavelengths for measuring an overlay are selected, may be greater than a set reference value. According to some example embodiments, the set reference value may be a design parameter determined through empirical study. Here, the width of the plateau region PR may be a difference between both end values of the wavelengths included in the plateau region PR. As described above, at least one of the wavelengths for measuring the overlay may be insensitive with respect to the process error. Thus, the plateau region PR including the wavelengths for measuring the overlay, may be a sufficiently large region.

In some example embodiments, wavelengths for measuring an overlay may be selected from each of the plurality of plateau regions PR. In this case, a plurality of wavelengths for measuring an overlay may be selected from each of the plurality of plateau regions PR. However, some example embodiments are not limited thereto. For example, one wavelength for measuring the overlay may also be selected from some of the plurality of plateau regions PR.

In some example embodiments, the plateau regions PR from which three or more wavelengths for measuring the overlay are selected, may be placed between two resonance regions RR. The plateau regions PR from which one or two wavelengths for measuring the overlay are selected, may be disposed adjacent to one resonance region RR.

When plateau regions PR are individually obtained from each of overlay marks horizontally apart from one another, the plateau regions PR may be different from each other in each of the overlay marks. In this case, the plateau region PR may be determined as an intersection of plateau regions PR of all the overlay marks.

Figure 10:
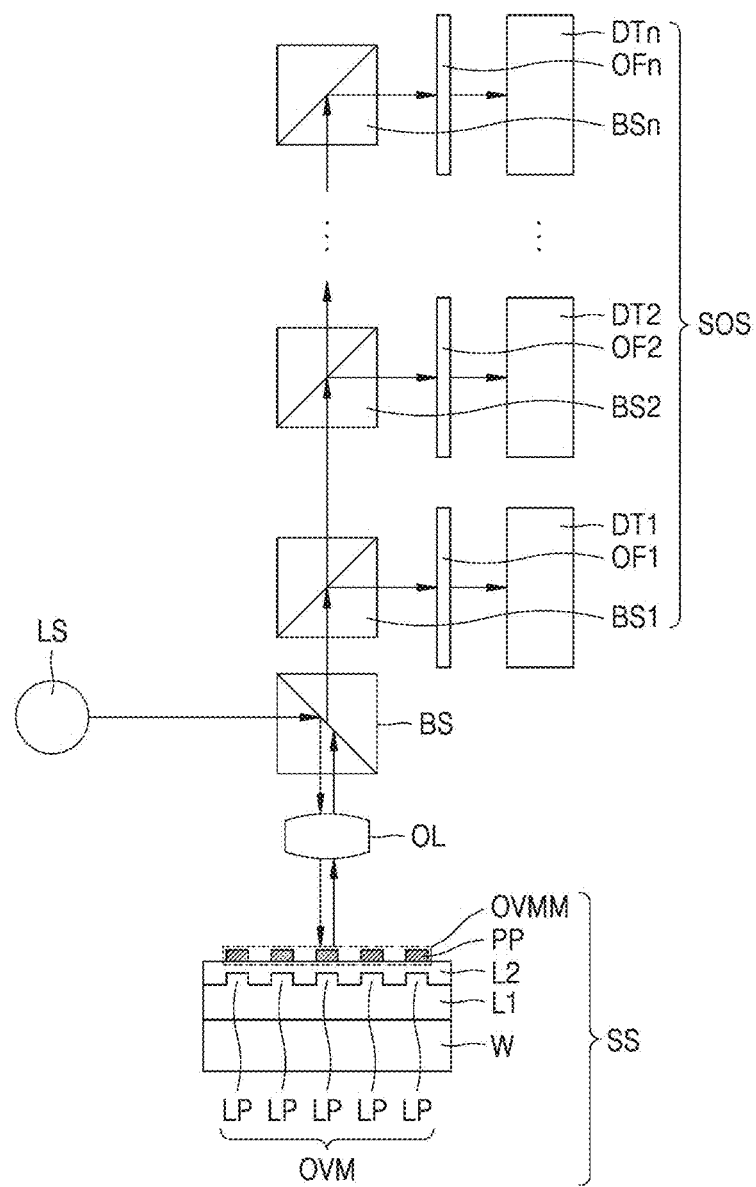
FIG. 10 is a cross-sectional view illustrating measurement of an overlay according to some example embodiments.

FIG. 10 is a cross-sectional view illustrating measurement of an overlay according to some example embodiments.

Referring to FIGS. 8 and 10, in operation P120, the overlay may be measured (e.g., by the at least one processor). In some example embodiments, measurement of the overlay may be performed by (e.g., using) a light having a plurality of wavelengths for measuring the overlay selected in operation P110. According to some example embodiments, one or more overlays may be measured (e.g., by the at least one processor) by radiating a light having a wavelength band (e.g., a plurality of wavelengths) on a semiconductor structure SS. Each of the one or more overlays may indicate an amount of consistency and/or misalignment between layers of the semiconductor structure.

The light radiated by the light source LS may be radiated onto the semiconductor structure SS due to (e.g., via) the beam splitter BS. Progression of the light in FIG. 10 is indicated by straight arrows.

The light source LS may be a light source that may emit light having a certain wavelength band(s). In some example embodiments, the light emitted from the light source LS may have a wavelength band including wavelengths for measuring the overlay selected in operation P110.

The beam splitter BS may split incident light into two lights (e.g., two light beams). The beam splitter BS may reflect a part of the incident light and may transmit the other part thereof (e.g., according to wavelengths of the light). The beam splitter BS may reflect the light radiated by the light source LS.

The light reflected by the beam splitter BS may be focused in a set position of the semiconductor structure SS using an objective lens OL. The light focused on the semiconductor structure SS may be diffracted by the overlay mark OVM and/or the overlay mark mold OVMM.

The diffracted light may transmit through the beam splitter BS and may be transmitted to a spectral optical system SOS. In some example embodiments, two or more spectral optical systems SOS may be provided to correspond to two first-order diffracted lights. In some example embodiments, the spectral optical system SOS may include a plurality of beam splitters BS1 to BSn, optical filters OF1 to OFn, and detectors DT1 to DTn. In some example embodiments, the splitters BS1 to BSn may be arranged in a cascading manner. The light reflected by the beam splitters BS1 to BSn may reach the detectors DT1 to DTn via the optical filters OF1 to OFn. Light that transmits through one among the beam splitters BS1 to BSn may reach the subsequent beam splitters BS2 to BSn. For example, light that transmits through the first beam splitter BS1 may reach the second beam splitter BS2.

One selected from lights having the above-mentioned wavelengths for measuring the overlay may transmit through the optical filters OF1 to OFn that are a kind of band pass filters. According to some example embodiments, light of one or more of the above-mentioned selected wavelengths may transmit (e.g., pass) through one or more of the optical filters OF1 to OFn to be detected by a corresponding one of the detectors DT1 to DTn. The optical filters OF1 to OFn may be variable color filters having a varying center frequency. However, some example embodiments are not limited thereto. The optical filters OF1 to OFn may correspond to different wavelengths for measuring the overlay.

Measurement of the overlay may be performed in each of the overlay marks OVM and/or the overlay mark molds OVMM placed in different positions. According to some example embodiments, the overlay may be fitted to have a continuous value with respect to the entire wafer using a method of an overlay metrology. According to some example embodiments, operations described herein as being performed by any or all of the light source LS, the optical filters OF1 to OFn, and/or the detectors DT1 to DTn may be performed by at least one processor (e.g., the track control unit TCU, the supervisory control system SCS, and/or the lithography control unit LACU) executing program code that includes instructions corresponding to the operations. The instructions may be stored in a memory. For example, the one or more selected wavelengths that pass through the one or more optical filters OF1 to OFn may be selected by the at least one processor.

The optical system illustrated in FIG. 10 is an example of a method of measuring diffracted light when the overlay is measured and does not limit the technical spirit of some example embodiments in any sense. Measurement of the overlay may be performed by a certain optical configuration in which spectrum with respect of lights having a plurality of wavelengths may be performed.

Subsequently, referring to FIG. 8, in operation P130, an overlay deviation may be calculated (e.g., by the at least one processor). The overlay deviation may be calculated by a difference operation of the overlay measured by different wavelengths (e.g., the wavelengths selected in operation P110 and/or the wavelengths passed by the optical filters OF1 to OFn) for measuring the overlay.

A measurement value of the overlay measured by an apparatus for measuring an overlay includes an overlay error based on a non-ideal and/or less ideal shape of overlay marks and thus may be expressed as shown in the following Equation 3:

$$OV_{ms}(\lambda) = OV_{real} + OV_{error}(\lambda) \qquad (3),$$

where $OV_{real}$ is a real overlay, $OV_{ms}(\lambda)$ and $OV_{error}(\lambda)$ are a measurement value measured by a wavelength $\lambda$ and an error, that is, a difference between a real value and the measurement value, respectively. $OV_{real}$ may be determined by a real horizontal relative position of the first layer L1 and the photoresist pattern PP and thus does not depend on $\lambda$. In order to know an accurate overlay value, the overlay error value may be compensated for. However, in the DBO technology, it is difficult or impossible to separate a real overlay value based on interlayer alignment and an overlay error based on shape distortion of the overlay mark from the overlay measurement value.

In some example embodiments, the overlay deviation may be expressed as shown in the following Equation 4:

$$\Delta OV1 \equiv OV_{ms}(\lambda 1) - OV_{ms}(\lambda 2) \qquad (4)$$
$$= \{OV_{real} + OV_{error}(\lambda 1)\} - \{OV_{real} + OV_{error}(\lambda 2)\}$$
$$= OV_{error}(\lambda 1) - OV_{error}(\lambda 2)$$
$$\Delta OV2 \equiv OV_{ms}(\lambda 1) - OV_{ms}(\lambda 3),$$

where $OV_{ms}(\lambda 1)$ is a first overlay measured by the first wavelength $\lambda 1$ selected in operation P110, and $OV_{ms}(\lambda 2)$ is a second overlay measured by the second wavelength $\lambda 2$ selected in operation P110, and $OV_{ms}(\lambda 3)$ is a third overlay measured by the third wavelength $\lambda 3$ selected in operation P110.

$OV_{error}(\lambda 1)$ is an error component of the first overlay measured by the first wavelength $\lambda 1$, and $OV_{error}(\lambda 2)$ is an error component of the second overlay measured by the second wavelength $\lambda 2$.

Also, $\Delta OV1$ is a first overlay deviation that is a difference between the first overlay $OV_{ms}(\lambda 1)$ and the second overlay $OV_{ms}(\lambda 2)$, and $\Delta OV2$ may be a second overlay deviation that is a difference between the first overlay $OV_{ms}(\lambda 1)$ and the third overlay $OV_{ms}(\lambda 3)$.

When two wavelengths for measuring an overlay are selected in one plateau region PR shown in FIG. 9A, one overlay deviation may be calculated, and two overlay deviations may be calculated when three wavelengths for measuring an overlay are selected.

Referring to Equation 4, a difference between overlay measurement values may be obtained so that an overlay deviation value including a difference between overlay errors excluding a real overlay value, e.g., $OV_{real}$, may be obtained. Thus, an error of the overlay may be separated from the real overlay value. Thus, the reliability of process monitoring may be improved.

Subsequently, referring to operation P140, process evaluation may be performed (e.g., by the at least one processor). Evaluation of a process may include evaluating the first overlay deviation value calculated in operation P130 and/or dispersion and defects in a second overlay error process.

Figure 11A:
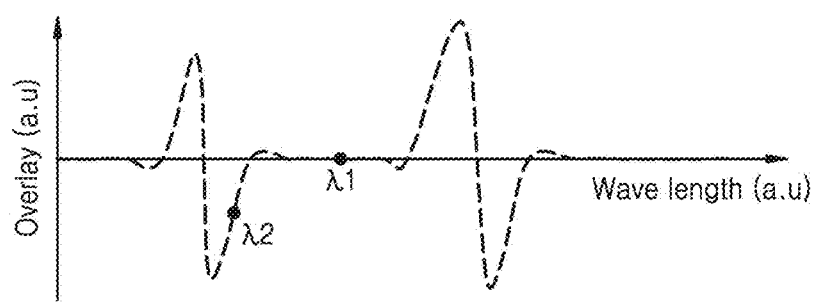
FIGS. 11A through 11D are graphs illustrating the effects of the process-monitoring method according to some example embodiments.
Figure 11B:
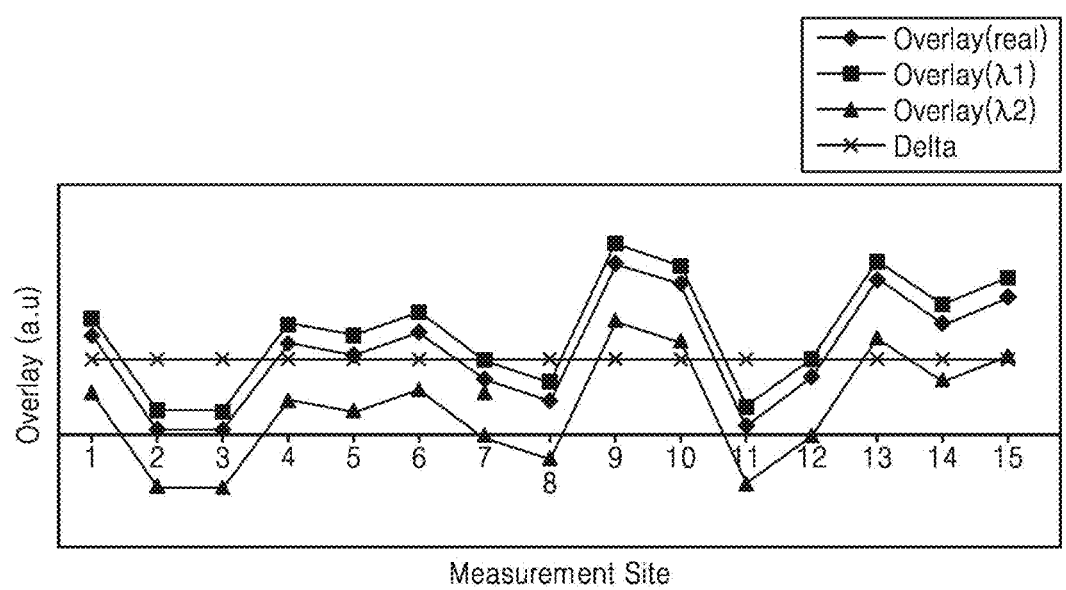
Figure 11C:
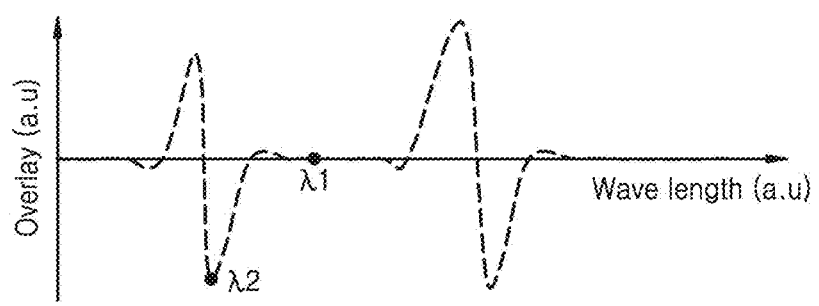
Figure 11D:
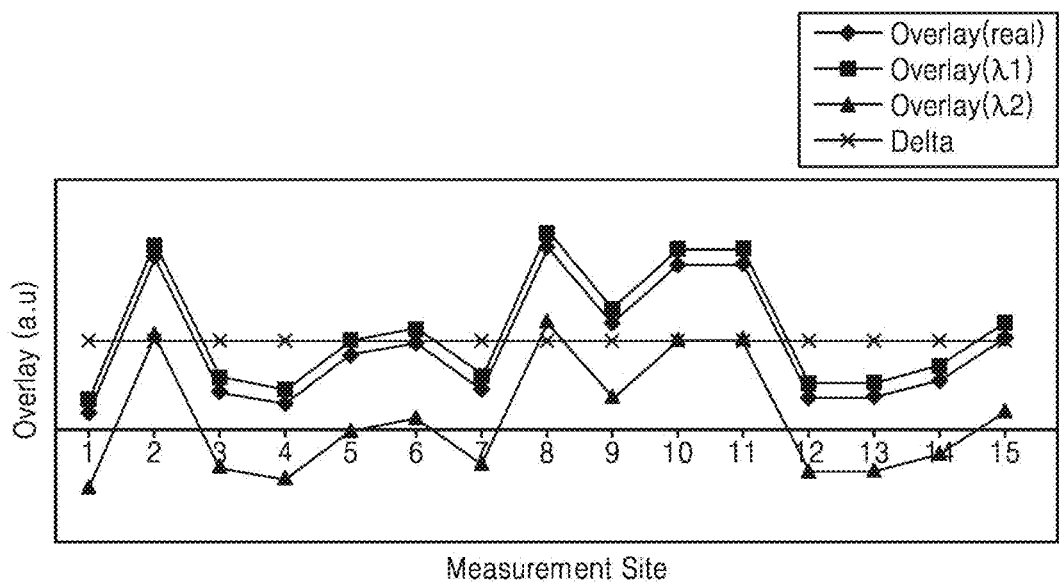

FIGS. 11A through 11D are graphs illustrating the effects of the process-monitoring method according to some example embodiments. More specifically, FIGS. 11A and 11B are graphs showing a first process that is different from an ideal and/or desired process, and FIGS. 11C and 11D are graphs showing a second process that is different from the ideal and/or desired process.

Referring to FIG. 11A, positions of the first wavelength $\lambda 1$ and the second wavelength $\lambda 2$ on an overlay spectrum in the first process are shown. The first and second wavelengths $\lambda 1$ and $\lambda 2$ are wavelengths selected in the central portion and at a boundary of the plateau region in a standard process, e.g., when an overlay mark and an overlay mark mold are ideally and/or desirably formed. In FIG. 11A, the overlay spectrum makes a parallel translation due to the process error of the first process so that the second wavelength $\lambda 2$ is placed outside the plateau region and the first wavelength $\lambda 1$ is placed inside the plateau region. Thus, the first overlay deviation $\Delta OV1$ may be increased compared to in an ideal and/or desired process. In some example embodiments, the occurrence of the process error may be evaluated using the first overlay deviation $\Delta OV1$.

Referring to FIG. 11B, numbers on the horizontal axis of FIG. 11B represent ordinal numbers for identifying different overlay marks, and the vertical axis represents overlay error values indicated in an arbitrary unit. Here, a real overlay value $OV_{real}$ may be a value measured by an imaged based overlay (IBO) technology. A first overlay due to the first wavelength $\lambda 1$ indicated by a rectangular dot, a second overlay due to the second wavelength $\lambda 2$ indicated by a triangular dot, and a real overlay change according to measurement positions, whereas an overlay deviation Delta is constant.

Referring to FIG. 11C, an overlay spectrum and positions of the first wavelength $\lambda 1$ and the second wavelength $\lambda 2$ on the overlay spectrum in the second process are shown. In FIG. 11C, parallel translation of the overlay spectrum due to the process error may be greater than parallel translation of FIG. 11A. Thus, the second wavelength $\lambda 2$ may be farther from a plateau region of the overlay spectrum than FIG. 11A, and the first wavelength $\lambda 1$ is placed inside the plateau region. Thus, a first overlay deviation $\Delta OV1$ may be increased compared to in the first process. In some example embodiments, a change of the process error may be evaluated using the change of the first overlay deviation $\Delta OV1$.

Referring to FIG. 11D, similarly to FIG. 11B, an overlay mark value $OV_{ms}(\lambda 1)$ due to the first wavelength, an overlay mark value $OV_{ms}(\lambda 2)$ due to the second wavelength, a real overlay value $OV_{real}$, and a first overlay deviation $\Delta OV1$ in the first process are shown in each of overlay marks.

Referring to FIG. 11D, similarly to FIG. 11B, the overlay deviation has a relatively constant value and thus, the process may be evaluated using the overlay deviation. A relatively small overlay deviation may mean that the process is performed similarly to an ideal and/or desired process, and a relatively large overlay deviation may mean that a process error occurs.

In sum, the description given with reference to FIGS. 11A through 11D, the occurrence of the process error may be monitored through overlay measurement using two wavelengths.

Conventional devices and methods for performing DBO produce erroneous overlay measurements due to misalignment and/or shape distortion of the overlay mark OVM and/or the overlay mark mold OVMM (also referred to herein as process errors). In particular, the conventional devices and methods use a single wavelength of light to perform the DBO. However, the conventional devices and methods are unable to determine an overlay error value (e.g., of the erroneous overlay measurements) based on the DBO performed using the single wavelength, and are thus, are unable to compensate for the overlay error value. As a result, the conventional devices and methods produce erroneous and/or unreliable overlay measurements.

However, some example embodiments provide improved devices and methods for performing DBO using multiple wavelengths of light. At least one of the multiple wavelengths is selected to be insensitive and/or less sensitive to changes in an overlay spectrum caused by the process errors.

By performing the DBO using the multiple wavelengths, the improved devices and methods are able to determine an overlay error value, and to compensate for the overlay error value. Accordingly, the improved devices and methods may eliminate and/or reduce erroneous overlay measurements, and thus, produce more reliable overlay measurements. Further, the improved devices and methods may use the determined overlay error values to make improvements to processes of manufacturing semiconductor structures.

Figure 12A:
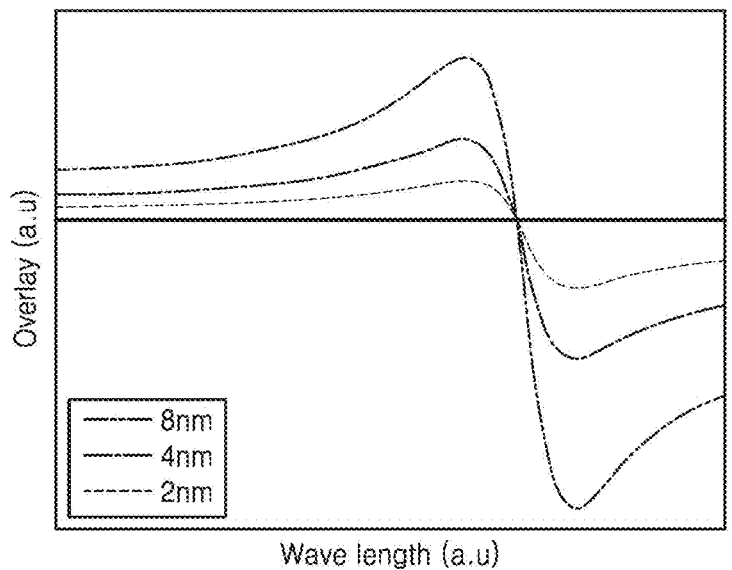
FIGS. 12A and 12B are graphs illustrating aspects of a change of an overlay spectrum according to types of process errors.
Figure 12B:
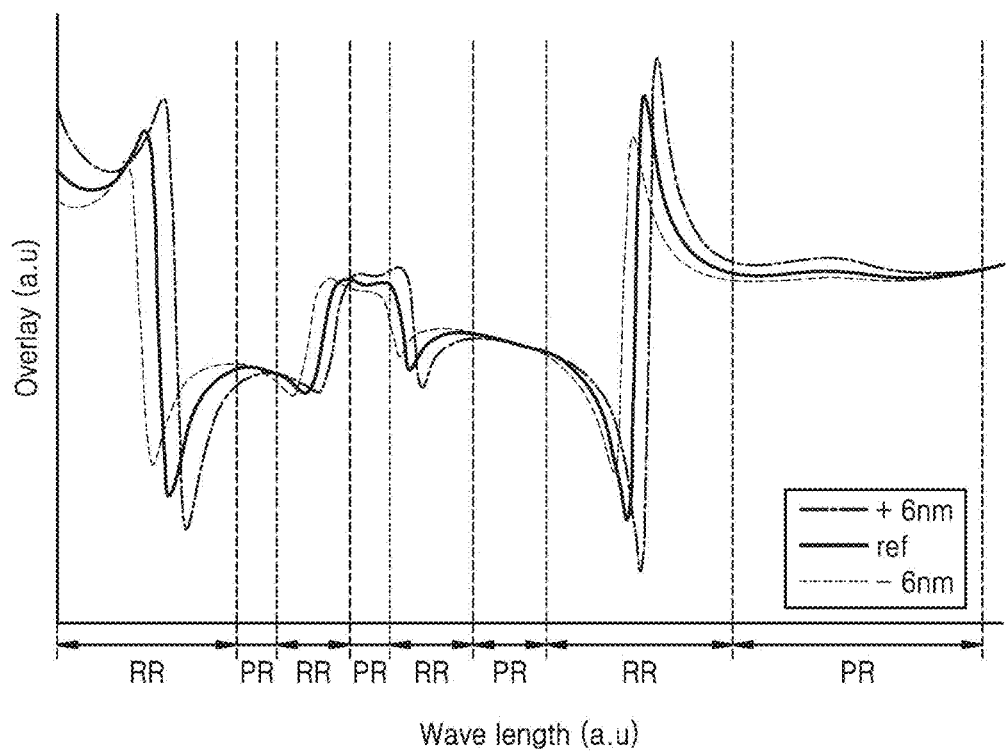

FIGS. 12A and 12B are graphs illustrating aspects of a change of an overlay spectrum according to types of process errors.

Referring to FIG. 12A, a solid line represents an overlay spectrum when asymmetry does not occur, a dashed line represents an overlay spectrum when asymmetry of about 2 nm occurs, a dot-and-dash line represents an overlay spectrum when asymmetry of about 4 nm occurs, and a double dot line represents overlay spectrum when asymmetry of about 8 nm occurs. In FIG. 12A, the greater the severity of the degree of asymmetry, the larger the change of an overlay spectrum.

Referring to FIG. 12B, a solid line(ref) represents when an underlying layer under a photoresist pattern, that is, the second layer L2 of FIG. 10 has a designed (e.g., an ideal and/or desired) thickness, a dashed line represents when the thickness of the underlying layer is decreased by about 6 nm (−6 nm) compared to design, and a dot-and-dash line represents when the thickness of the underlying layer is increased by about 6 nm (+6 nm) compared to design. In FIG. 12B, when the thickness of the underlying layer is increased, the overlay spectrum may be moved to the right (e.g., via a parallel translation), and when the thickness of the underlying layer is reduced, the overlay spectrum may be moved to the left (e.g., via a parallel translation). Or, when the thickness of the underlying layer is reduced, the plateau region of the overlay spectrum may be relatively moved to the left (e.g., via a parallel translation).

These types of process errors may be checked using the changed shape of the overlay spectrum according to the process errors and the first and second overlay deviations $\Delta OV1$, $\Delta OV2$. Hereinafter, the case where the first wavelength $\lambda 1$ is longer than the second wavelength $\lambda 2$ (e.g., the length of the first wavelength $\lambda 1$ is longer than the length of the second wavelength $\lambda 2$) and is shorter than the third wavelength $\lambda 3$ (e.g., the length of the first wavelength $\lambda 1$ is shorter than the length of the third wavelength $\lambda 3$), will be described.

In some example embodiments, when an absolute value of first overlay deviation $\Delta OV1$ is significantly different from that of the ideal and/or desired case (e.g., above an upper limit or below a lower limit of a defined threshold range around a defined value representing the ideal and/or desired case), whereas an absolute value of the second overlay deviation $\Delta OV2$ is the same or similar to that of the ideal and/or desired case (e.g., within the defined threshold range around the defined value representing the ideal and/or desired case), the overlay spectrum may be moved to the right compared to the ideal and/or desired process. According to some example embodiments, the defined threshold range and/or the defined value may be design parameters determined through empirical study. Thus, it may be determined that there is a process error in which the thickness of the underlying layer under the photoresist pattern (e.g., the second layer) is increased compared to (e.g., greater than) the design (e.g., the ideal and/or desired thickness).

In some example embodiments, when an absolute value of the second overlay deviation $\Delta OV2$ is significantly different from that of the ideal and/or desired case (e.g., above an upper limit or below a lower limit of a defined threshold range around a defined value representing the ideal and/or desired case), whereas an absolute value of first overlay deviation $\Delta OV1$ is the same or similar to that of the ideal and/or desired case (e.g., within the defined threshold range around the defined value representing the ideal and/or desired case), the overlay spectrum may be moved to the left compared to the ideal and/or desired process. According to some example embodiments, the defined threshold range and/or the defined value may be design parameters determined through empirical study. Thus, it may be determined that there is a process error in which the thickness of the underlying layer of the photoresist pattern (e.g., the second layer) is reduced compared to (e.g., less than) the design (e.g., the ideal and/or desired thickness).

In some example embodiments, when the absolute values of the first and second overlay deviations $\Delta OV1$, $\Delta OV2$ are larger than those in the ideal and/or desired case (e.g., above a defined threshold value representing the ideal and/or desired case), it may be determined that the overlay mark and/or the overlay mark mold (e.g., one or more overlay marks and/or one or more overlay mark molds) have a relatively asymmetric shape. According to some example embodiments, when the absolute values of the first and second overlay deviations $\Delta OV1$, $\Delta OV2$ are below the defined threshold value representing the ideal and/or desired case, it may be determined that the overlay mark and/or the overlay mark mold (e.g., one or more overlay marks and/or one or more overlay mark molds) have a relatively symmetric (e.g., not asymmetric) shape. According to some example embodiments, the defined threshold value may be a design parameter determined through empirical study.

In some example embodiments, when the absolute values of the first and second overlay deviations $\Delta OV1$, $\Delta OV2$ are the same or similar to those in the ideal and/or desired case, it may be determined that the overlay mark and/or the overlay mark mold have a relatively symmetric shape.

In some example embodiments, the aspect and/or degree of an error of the thickness of a layer to be patterned (e.g., the thickness of the layer to be patterned is increased or reduced) may be determined. In some example embodiments, it may be determined whether the overlay mark and/or the overlay mark mold have an asymmetric shape or not.

In some example embodiments, feedback signals regarding the photolithography process described with reference to FIGS. 1 and 2 may be generated (e.g., by the at least one processor) based on the result of determination in operation P140. Thus, reliability of a process of a semiconductor structure to be processed subsequently may be improved.

Figure 13:
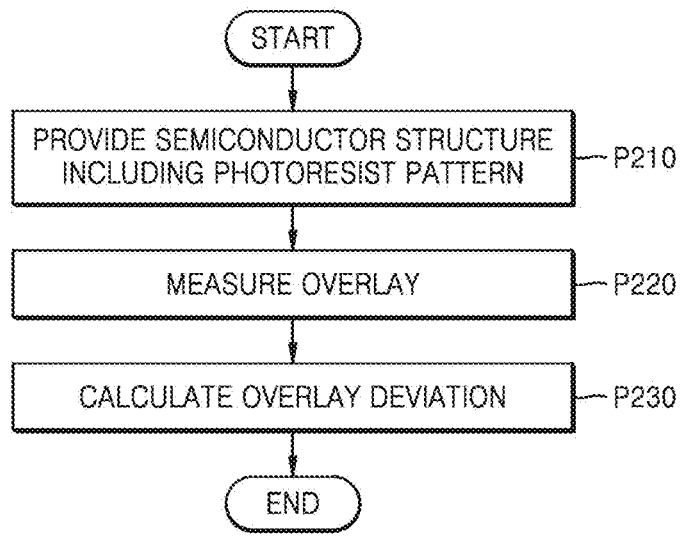
FIGS. 13 and 14 are flowcharts illustrating a method of manufacturing a semiconductor device, according to some example embodiments.
Figure 14:
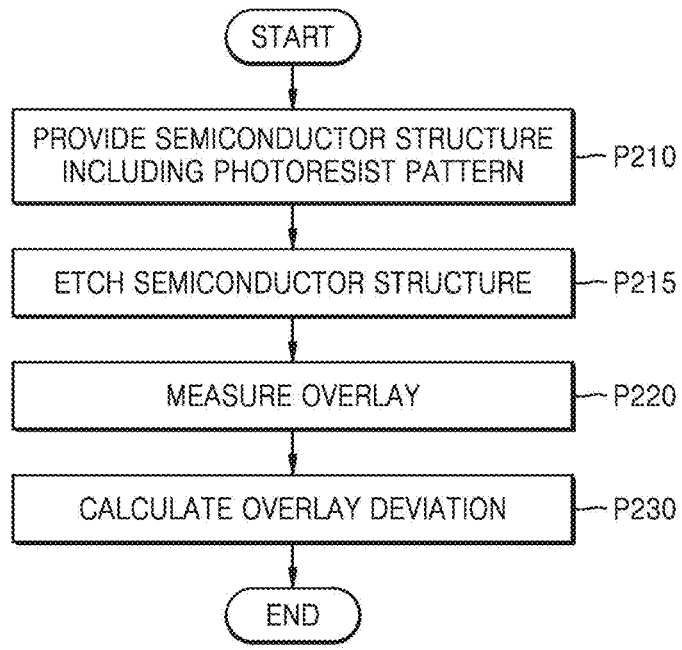

FIGS. 13 and 14 are flowcharts illustrating a method of manufacturing a semiconductor device according to some example embodiments. Any or all of the operations described as being performed in association with the method of manufacturing a semiconductor device as illustrated in FIGS. 13 and 14 (e.g., operations P210, P215, P220 and/or P230) may be performed by at least one processor (e.g., the track control unit TCU, the supervisory control system SCS, and/or the lithography control unit LACU) executing program code that includes instructions corresponding to the operations. The instructions may be stored in a memory.

Referring to FIG. 13, in operation P210, a semiconductor structure including a photoresist pattern may be provided (e.g., by the at least one processor).

Providing the semiconductor structure including the photoresist pattern may include performing of spin coating, exposure, and/or development processes of a photoresist material layer, as described with reference to FIGS. 1 and 2. Also, the semiconductor structure provided in operation P210 may be similar to the semiconductor structures SS described with reference to FIGS. 6A through 6C.

Subsequently, in operation P220, an overlay of the semiconductor structure may be measured (e.g., by the at least one processor), and in operation P230, an overlay deviation may be calculated (e.g., by the at least one processor). Operations P220 and P230 may be the same or substantially the same as operations P120 and P130 described with reference to FIG. 8, respectively.

Thus, a method of manufacturing a semiconductor structure in which reliability of measurement of the overlay error may be improved and a process error may be monitored in real time, may be provided.

Operations depicted in FIG. 14 (e.g., operations P210, P220 and/or P230) that are the same as or similar to operations described in association with FIG. 13 will not be described in detail in association with FIG. 14. Referring to FIG. 14, unlike in FIG. 13, in operation P210, the semiconductor structure may be provided, and then, in operation P215, the semiconductor structure may be etched.

Etching of the semiconductor structure may include etching of the semiconductor structure through dry and/or wet etching using the photoresist pattern as an etching mask.

The various operations of methods described above may be performed by any suitable device capable of performing the operations, such as various hardware and/or software implemented in some form of hardware (e.g., the at least one processor).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or operations of a method or algorithm and functions described in connection with some example embodiments disclosed herein may be embodied directly in hardware, in a software module executed by a processor (e.g., the at least one processor), or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While the some example embodiments have been particularly shown and described with reference to examples thereof, it will be understood that various changes in form and details may be made therein without departing from the spirit and scope of the following claims.

What is claimed is:

1. A method of manufacturing a semiconductor device, the method comprising:
    forming a plurality of overlay molds on a semiconductor structure by developing a photoresist material layer on the semiconductor structure, the semiconductor structure including a first layer and a second layer on the first layer, the first layer having a plurality of overlay marks and the plurality of overlay molds at least partially overlapping at least some of the plurality of overlay marks; and
    measuring one or more overlays by radiating a light having a wavelength band onto the semiconductor structure, the wavelength band being set based on the plurality of overlay marks and the plurality of overlay molds.

2. The method of claim 1, wherein the measuring the one or more overlays includes diffracting the light.

3. The method of claim 1, further comprising:
    obtaining a first overlay deviation that is a difference between a first overlay among the one or more overlays and a second overlay among the one or more overlays, the first overlay being based on a first wavelength of the wavelength band, the second overlay being based on a second wavelength of the wavelength band.

4. The method of claim 3, further comprising:
    obtaining a second overlay deviation that is a difference between the first overlay and a third overlay among the one or more overlays, the third overlay being based on a third wavelength of the wavelength band.

5. The method of claim 4, wherein a length of the first wavelength is longer than a length of the second wavelength and is shorter than a length of the third wavelength.

6. The method of claim 5, further comprising:
    evaluating the method of manufacturing a semiconductor device based on at least one of a first absolute value of the first overlay deviation and a second absolute value of the second overlay deviation.

7. The method of claim 6, wherein the evaluating the method of manufacturing a semiconductor device comprises:
    determining the one or more of the plurality of overlay molds is asymmetrical in response to determining the first absolute value of the first overlay deviation and the second absolute value of the second overlay deviation are higher than a defined threshold value;
    determining the thickness of the second layer is greater than a desired thickness in response to determining the first absolute value of the first overlay deviation is higher than an upper limit of a defined threshold range and the second absolute value of the second overlay deviation is within the defined threshold range; and
    determining the thickness of the second layer is less than the desired thickness in response to determining the second absolute value of the second overlay deviation is higher than the upper limit of the defined threshold range and the first absolute value of the first overlay deviation is within the defined threshold range.

8. A method of manufacturing a semiconductor device, the method comprising:
    radiating light having a wavelength band onto a semiconductor structure, the semiconductor structure having a first layer, a second layer on the first layer, and a photoresist pattern on the second layer, the first layer including a plurality of overlay marks, the photoresist pattern including an overlay mold, the wavelength band being set based on the plurality of overlay marks and the overlay mold;
    diffracting the light to generate diffracted light; and
    splitting the diffracted light according to wavelength.

9. The method of claim 8, further comprising:
    obtaining a first overlay deviation that is a difference between a first overlay and a second overlay, the first overlay being based on a first wavelength of the wavelength band, the second overlay being based on a second wavelength of the wavelength band, wherein the splitting the diffracted light splits the diffracted light into light of the first wavelength and light of the second wavelength.

10. The method of claim 9, further comprising:
obtaining a second overlay deviation that is a difference between the first overlay and a third overlay, the third overlay being based on a third wavelength of the wavelength band,
wherein the splitting the diffracted light splits the diffracted light into light of the first wavelength, light of the second wavelength, and light of the third wavelength.

11. The method of claim 10, wherein a length of the first wavelength is longer than a length of a second wavelength and is shorter than a length of the third wavelength.

12. The method of claim 10, further comprising:
determining the overlay mold is asymmetrical in response to determining a first absolute value of the first overlay deviation and a second absolute value of the second overlay deviation are higher than a defined threshold value; and
determining the overlay mold is not asymmetrical in response to determining the first absolute value of the first overlay deviation and the second absolute value of the second overlay deviation are lower than the defined threshold value.

13. The method of claim 10, further comprising:
determining a thickness of the second layer is greater than a desired thickness in response to determining a first absolute value of the first overlay deviation is higher than an upper limit of a defined threshold range and a second absolute value of the second overlay deviation is within the defined threshold range; and
determining the thickness of the second layer is less than the desired thickness in response to determining the second absolute value of the second overlay deviation is higher than the upper limit of the defined threshold range and the first absolute value of the first overlay deviation is within the defined threshold range.

14. A method of manufacturing a semiconductor device, the method comprising:
selecting a plurality of wavelengths based on an overlay spectrum including a plurality of determined overlay values corresponding to different wavelengths of light, the plurality of determined overlay values being based on a plurality of overlay marks and an overlay mold of a semiconductor structure, the semiconductor structure including a first layer, a second layer on the first layer, and a photoresist material layer on the second layer, the first layer including the plurality of overlay marks, the photoresist material layer including the overlay mold;
measuring one or more overlays by radiating a light including the plurality of wavelengths onto the semiconductor structure;
diffracting the light to generate diffracted light; and
splitting the diffracted light according to wavelength.

15. The method of claim 14, further comprising:
obtaining a first overlay deviation that is a difference between a first overlay and a second overlay, the first overlay being based on a first wavelength among the plurality of wavelengths, the second overlay being based on a second wavelength among the plurality of wavelengths,
wherein the splitting the diffracted light splits the diffracted light into light of the first wavelength and light of the second wavelength.

16. The method of claim 15, further comprising:
obtaining a second overlay deviation that is a difference between the first overlay and a third overlay, the third overlay being based on a third wavelength among the plurality of wavelengths,
wherein the splitting the diffracted light splits the diffracted light into light of the first wavelength, light of the second wavelength, and light of the third wavelength.

17. The method of claim 16, wherein the selecting the plurality of wavelengths comprises:
determining a plateau region in which a second partial derivative function with respect to the different wavelengths of the overlay spectrum is smaller than a set value; and
selecting the first wavelength, the second wavelength, and the third wavelength from among multiple wavelengths within the plateau region.

18. The method of claim 17, wherein the selecting the first wavelength, the second wavelength, and the third wavelength from among multiple wavelengths within the plateau region comprises:
selecting the second wavelength and the third wavelength from boundary points of the plateau region; and
selecting the first wavelength from a point between the boundary points.

19. The method of claim 16, further comprising:
determining the overlay mold is asymmetrical in response to determining a first absolute value of the first overlay deviation and a second absolute value of the second overlay deviation are higher than a defined threshold value; and
determining the overlay mold is not asymmetrical in response to determining the first absolute value of the first overlay deviation and the second absolute value of the second overlay deviation are lower than the defined threshold value.

20. The method of claim 16, further comprising:
determining a thickness of the second layer is greater than a desired thickness in response to determining a first absolute value of the first overlay deviation is higher than an upper limit of a defined threshold range and a second absolute value of the second overlay deviation is within the defined threshold range; and
determining the thickness of the second layer is less than the desired thickness in response to determining the second absolute value of the second overlay deviation is higher than the upper limit of the defined threshold range and the first absolute value of the first overlay deviation is within the defined threshold range.

* * * * *